(12) United States Patent
Zhang et al.

(10) Patent No.: US 12,482,590 B2
(45) Date of Patent: Nov. 25, 2025

(54) MAGNETIC POWER COMPONENT AND POWER MODULE TO WHICH MAGNETIC POWER COMPONENT IS APPLIED

(71) Applicant: Huawei Technologies Co., Ltd., Shenzhen (CN)

(72) Inventors: Xijun Zhang, Dongguan (CN); Jia Li, Xi'an (CN); Jun Yao, Dongguan (CN); Chao Gao, Dongguan (CN); Qiang Gao, Dongguan (CN); Zhitao Li, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 633 days.

(21) Appl. No.: 17/895,507

(22) Filed: Aug. 25, 2022

(65) Prior Publication Data

US 2023/0075194 A1   Mar. 9, 2023

(30) Foreign Application Priority Data

Aug. 26, 2021   (CN) .......................... 202110989889.0

(51) Int. Cl.
*H01F 27/24*   (2006.01)
*H01F 27/08*   (2006.01)
*H05K 1/18*   (2006.01)

(52) U.S. Cl.
CPC .............. *H01F 27/24* (2013.01); *H01F 27/08* (2013.01); *H05K 1/181* (2013.01)

(58) Field of Classification Search
CPC .......... H01F 27/24; H01F 27/08; H01F 27/22; H01F 27/266; H05K 1/181; H05K 1/0203; H05K 1/18; H05K 7/023; H05K 7/20172

USPC ................................................ 336/200, 223
See application file for complete search history.

(56) References Cited

U.S. PATENT DOCUMENTS

| | | | | |
|---|---|---|---|---|
| 2005/0270745 A1* | 12/2005 | Chen | .................. | H01F 27/2804 361/707 |
| 2009/0079528 A1* | 3/2009 | Shabany | ................. | H01F 27/22 29/606 |
| 2016/0035478 A1* | 2/2016 | Furui | .................. | H01F 27/2804 336/192 |
| 2017/0345756 A1 | 11/2017 | Yin et al. | | |

FOREIGN PATENT DOCUMENTS

| | | | |
|---|---|---|---|
| CN | 2006019418 A | | 1/2006 |
| CN | 201319297 Y | | 9/2009 |
| CN | 107437885 A | | 12/2017 |
| CN | 209183683 U | * | 7/2019 |
| JP | 2006019418 A | | 1/2006 |
| JP | 2020025036 A | | 2/2020 |
| WO | 2012155036 A2 | | 11/2012 |

* cited by examiner

*Primary Examiner* — Lincoln D Donovan
(74) *Attorney, Agent, or Firm* — Conley Rose, P.C.

(57) ABSTRACT

A magnetic power component includes a printed circuit board and a magnetic core assembled to the printed circuit board. The magnetic core includes a magnetic core body and a plurality of heat dissipation teeth. The magnetic core body is bonded to the printed circuit board. The plurality of heat dissipation teeth is protruded from an outer surface that is of the magnetic core body and that faces away from the printed circuit board. The plurality of heat dissipation teeth and the magnetic core body are bonded through direct contact.

20 Claims, 5 Drawing Sheets

MAGNETIC POWER COMPONENT AND POWER MODULE TO WHICH MAGNETIC POWER COMPONENT IS APPLIED

CROSS-REFERENCE TO RELATED APPLICATION

This claims priority to Chinese Patent Application No. 202110989889.0 filed on Aug. 26, 2021, which is hereby incorporated by reference in its entirety.

TECHNICAL FIELD

This disclosure relates to a magnetic power component and a power module to which the magnetic power component is applied.

BACKGROUND

As a power density of a power product continuously increases, an operating temperature of a magnetic power component such as a transformer or an inductor is increasingly high, but space for heat dissipation in the magnetic power component is increasingly small, posing a new challenge to heat dissipation measures of the magnetic power component. In a heat dissipation manner, a heat sink is adhered to a magnetic power component. The heat sink is adhered to a magnetic core by using glue with a relatively good coefficient of thermal conductivity, for heat dissipation. However, the heat dissipation manner has the following disadvantages: (1) Material costs: If an adhering area is relatively large, a relatively large amount of thermal conductive adhesive needs to be used, and costs are also high. (2) Applicable scenario: The heat sink is at risk of falling off in a harsh environment with a great temperature change, high humidity, or the like, such as an outdoor environment. (3) Process difficulty: A particular type of thermal conductive adhesive is required for adhering the heat sink. Otherwise, there is a risk that the magnetic core is cracked due to a relatively large coefficient of thermal expansion of the thermal conductive adhesive. In addition, a trade-off between a heat conduction capability and an adhering capability of the thermal conductive adhesive is further required. In another heat dissipation manner, a thermal pad is disposed between a magnetic core and a housing of a product, so that heat is dissipated from the housing after passing through the thermal pad. However, the heat dissipation manner has the following disadvantages: (1) Material costs: Costs of the thermal pad continuously increase as a thickness increases. (2) Applicable scenario: The heat dissipation manner is difficult to be applied to a scenario in which the magnetic core is far away from the housing. (3) Process difficulty: A high requirement is put forward for a dimensional tolerance of the magnetic core and the housing. When the thickness of the thermal pad is very small, contact between the magnetic core and the heat dissipation housing is not close enough, and a heat dissipation effect is poor. When the thickness of the thermal pad is very large, both the magnetic core and the housing bear relatively large stress after assembly, causing a risk such as cracking or deformation.

SUMMARY

A first aspect of embodiments of this disclosure provides a magnetic power component, including: a printed circuit board; and a magnetic core assembled to the printed circuit board, where the magnetic core includes a magnetic core body and a plurality of heat dissipation teeth, the magnetic core body is bonded to the printed circuit board, and the plurality of heat dissipation teeth are protruded from at least one outer surface that is of the magnetic core body and that faces away from the printed circuit board.

A surface heat dissipation area of the magnetic core is increased due to the design of the heat dissipation teeth of the magnetic core, thereby improving a heat dissipation capability. Therefore, a heat sink does not need to be additionally adhered to the magnetic core or a thermal pad does not need to be disposed on the magnetic core to implement connection to a housing, thereby effectively reducing a volume occupied by the magnetic power component. Because the magnetic core body is bonded to the printed circuit board, heat of the printed circuit board can be conducted to the magnetic core, and the heat is dissipated by using the magnetic core.

In an implementation of this disclosure, the magnetic core body includes a first magnetic core part and a second magnetic core part that are connected to each other, the first magnetic core part includes a main body part and at least one support part connected to a surface of the main body part, and the support part penetrates through the printed circuit board to be bonded to the second magnetic core part. The printed circuit board is located between the main body part and the second magnetic core part. The plurality of heat dissipation teeth is protruded from an outer surface that is of the first magnetic core part and that faces away from the printed circuit board and an outer surface that is of the second magnetic core part and that faces away from the printed circuit board.

Usually, the first magnetic core part and the second magnetic core part of the magnetic core body are separately formed. During assembly, the first magnetic core part and the second magnetic core part are respectively placed on two sides of the printed circuit board, so that the magnetic core body can be simply and quickly assembled to the printed circuit board. In addition, adhesive may be disposed on a bonding interface between the support part and the second magnetic core part, to firmly bond the first magnetic core part and the second magnetic core part.

In an implementation of this disclosure, at least one of the first magnetic core part and the second magnetic core part is bonded to the printed circuit board.

In an implementation of this disclosure, the first magnetic core part further includes at least one bump integrally formed with the main body part, and the at least one bump and the at least one support part are located on the same surface of the main body part; or at least one bump is disposed on a surface that is of the second magnetic core part and that faces the printed circuit board. The at least one bump is bonded to the printed circuit board.

There may be a plurality of bumps, to ensure a contact area between the first magnetic core part and the printed circuit board. A thickness of each bump is less than a thickness of the support part, so that the bump can be bonded to the printed circuit board. In this way, heat generated by the printed circuit board, especially, heat generated by a winding, can be conducted to the magnetic core by using the bump, and the heat is dissipated by using the magnetic core.

In an implementation of this disclosure, the first magnetic core part and heat dissipation teeth protruded from the surface of the first magnetic core part are integrally formed by using a magnetic material. The second magnetic core part and heat dissipation teeth protruded from the surface of the second magnetic core part are integrally formed by using a magnetic material.

In an implementation of this disclosure, the magnetic core is one of a UI-type magnetic core, an EE-type magnetic core, an EI-type magnetic core, or a UU-type magnetic core.

In an implementation of this disclosure, each heat dissipation tooth extends to be strip-shaped, and a plurality of heat dissipation teeth located on a same outer surface are parallel to each other and spaced apart.

There is a strip-shaped groove between two adjacent heat dissipation teeth located on a same outer surface, and a strip-shaped extension direction of the heat dissipation tooth is usually an air duct direction. If the two directions are inconsistent, an air flow rate is reduced, and a heat dissipation effect is reduced.

In an implementation of this disclosure, a thermal conductive interface material is disposed on a connection interface between the magnetic core body and the printed circuit board.

In an implementation of this disclosure, a width that is of each heat dissipation tooth and that is perpendicular to the extension direction is greater than or equal to 2 millimeters (mm).

In an implementation of this disclosure, a distance between two adjacent heat dissipation teeth located on a same outer surface is greater than or equal to 1 mm.

In an implementation of this disclosure, a height that is of each heat dissipation tooth and that is perpendicular to an outer surface on which the heat dissipation tooth is located is less than or equal to 2 mm.

In an implementation of this disclosure, the winding is integrated into the printed circuit board.

A second aspect of the embodiments of this disclosure provides a power module, including a substrate and the magnetic power component that is disposed on the substrate and that is described in the first aspect of the embodiments of this disclosure. The substrate is a circuit board.

In an implementation of this disclosure, the printed circuit board is perpendicularly plugged into the substrate.

A plurality of bulges is formed on an end face of the printed circuit board of the magnetic power component, so that the printed circuit board can be plug-connected to the substrate by using the bulges. Plug-connection holes are correspondingly disposed on the substrate, so that the printed circuit board can be plug-connected to the plug-connection holes of the substrate by using the bulges, and the printed circuit board is electrically connected to the substrate.

In an implementation of this disclosure, the power module further includes a heat dissipation fan disposed on the substrate, and the heat dissipation fan is located at an end of the magnetic power component.

In an implementation of this disclosure, the heat dissipation tooth of the magnetic power component extends to be strip-shaped, and an extension direction is consistent with an air duct direction of the heat dissipation fan.

A plurality of spaced-apart magnetic power components is disposed on the substrate, and printed circuit boards of the magnetic power components are disposed in an opposite and parallel manner. The heat dissipation fan is located at a same end of the plurality of magnetic power components. Air blown from the heat dissipation fan is blown to the two magnetic power components, and an air duct direction is consistent with an extension direction of a heat dissipation tooth of the magnetic power component. Heat generated on a surface of a magnetic core is quickly taken away by using flowing air blown from the heat dissipation fan, to implement a good heat dissipation effect, and prevent a device from being damaged due to a high temperature.

| SYMBOL DESCRIPTION OF MAIN ELEMENTS | |
|---|---|
| Magnetic power component | 100 |
| Magnetic core | 10 |
| Printed circuit board | 30 |
| Magnetic core body | 11 |
| Heat dissipation tooth | 13 |
| Groove | 130 |
| First magnetic core part | 111 |
| Second magnetic core part | 113 |
| Main body part | 112 |
| Support part | 114 |
| Through hole | 31 |
| Bump | 116 |
| Smooth region | 110 |
| Power module | 200 |
| Substrate | 210 |
| Heat dissipation fan | 40 |
| Bulge | 101 |

DESCRIPTION OF EMBODIMENTS

The following describes embodiments of this disclosure with reference to accompanying drawings in embodiments of this disclosure.

A magnetic power component such as a transformer or an inductor includes a magnetic core of a magnetic material. However, in an existing heat dissipation manner of the magnetic power component, a heat sink is adhered to the magnetic power component by using glue, and consequently an overall structure of the magnetic power component occupies larger space, and there is a risk that the heat sink falls off.

Figure 1A:
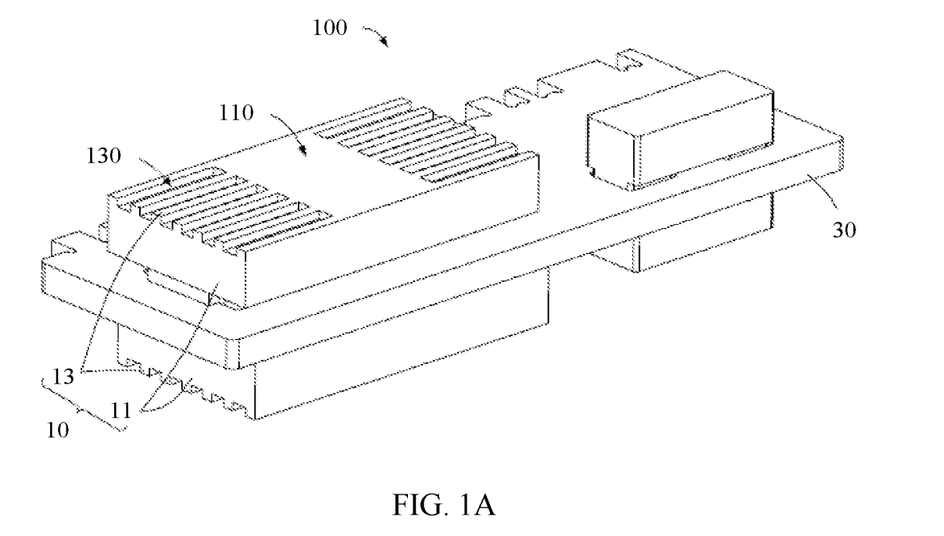
FIG. 1A is a schematic three-dimensional view of a magnetic power component according to an embodiment of this disclosure.
Figure 1B:
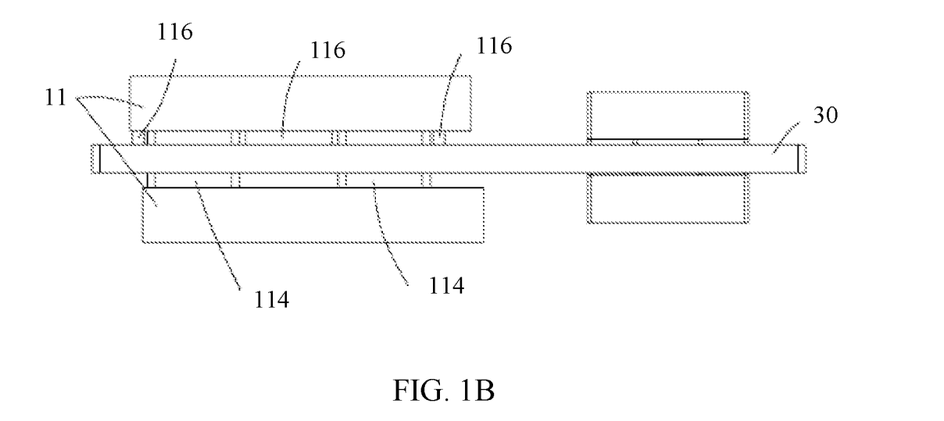
FIG. 1B is a schematic side view of the magnetic power component in FIG. 1A.

As shown in FIG. 1A and FIG. 1B, this disclosure provides a magnetic power component 100, including a magnetic core 10. The magnetic core 10 has a large specific surface area, and therefore has a large heat dissipation area. Both heat generated by the magnetic core 10 and heat generated by another component (such as a printed circuit board 30) can be effectively transferred by using the magnetic core 10.

As shown in FIG. 1A and FIG. 1B, the magnetic power component 100 further includes the printed circuit board 30, and the magnetic core 10 is assembled to the printed circuit board 30. The magnetic core 10 includes a magnetic core body 11 and a plurality of heat dissipation teeth 13 protruded from at least one outer surface of the magnetic core body 11. The magnetic core body 11 is bonded to the printed circuit board 30. The plurality of heat dissipation teeth 13 are protruded from at least one outer surface that is of the magnetic core body 11 and that face away from the printed circuit board 30. A groove 130 is formed between two adjacent heat dissipation teeth 13 on a same outer surface. A surface heat dissipation area of the magnetic core 10 is increased due to the design of the heat dissipation teeth 13, thereby improving a heat dissipation capability. Therefore, a heat sink does not need to be additionally adhered to the magnetic core 10 or a thermal pad does not need to be disposed on the magnetic core 10 to implement connection to a housing, thereby effectively reducing a volume occupied by the magnetic power component 100. In this embodiment, the printed circuit board 30 is a multi-layer structure, and a winding (not shown in the figure) is integrated into the printed circuit board 30. The winding is located in a magnetic circuit formed by the magnetic core 10. When the magnetic power component 100 operates, a current passes through the winding, and the winding heats up and generates a large amount of heat. Therefore, a heat dissipation path needs to be provided for the winding, namely, the printed circuit board 30. Otherwise, a resistivity of the winding increases.

The magnetic core 10 is made of a magnetic material, including but not limited to one of a metal magnetic material, an alloy magnetic material, and a ferrite magnetic material. In this embodiment, the heat dissipation teeth 13 and the magnetic core body 11 are at least partially integrally formed in a mold (not shown in the figure). The heat dissipation teeth 13 and the magnetic core body 11 are bonded through direct contact, and no medium (such as adhesive) is disposed between the heat dissipation teeth 13 and the magnetic core body 11 for adhering. Therefore, there is no risk that the heat dissipation teeth 13 fall off due to an adhesive failure, and heat can be directly conducted from the magnetic core body 11 to the heat dissipation teeth 13, so that heat dissipation efficiency is also relatively high.

In addition, because the magnetic core body 11 is bonded to the printed circuit board 30, heat of the printed circuit board 30 can be conducted to the magnetic core 10 by using the magnetic core body 11, and the heat is dissipated by using the magnetic core 10.

Figure 2:
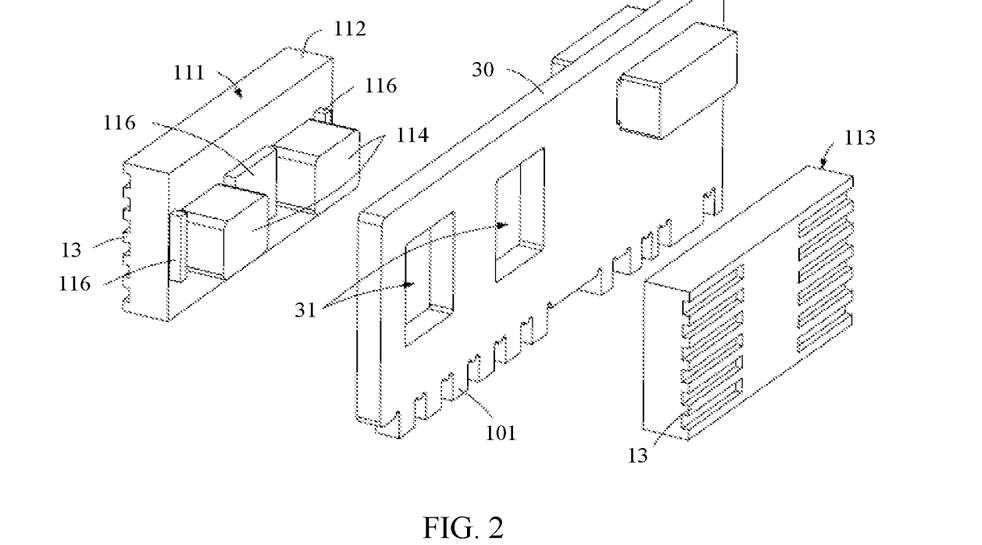
FIG. 2 is a schematic exploded view of the magnetic power component in FIG. 1.
Figure 3:
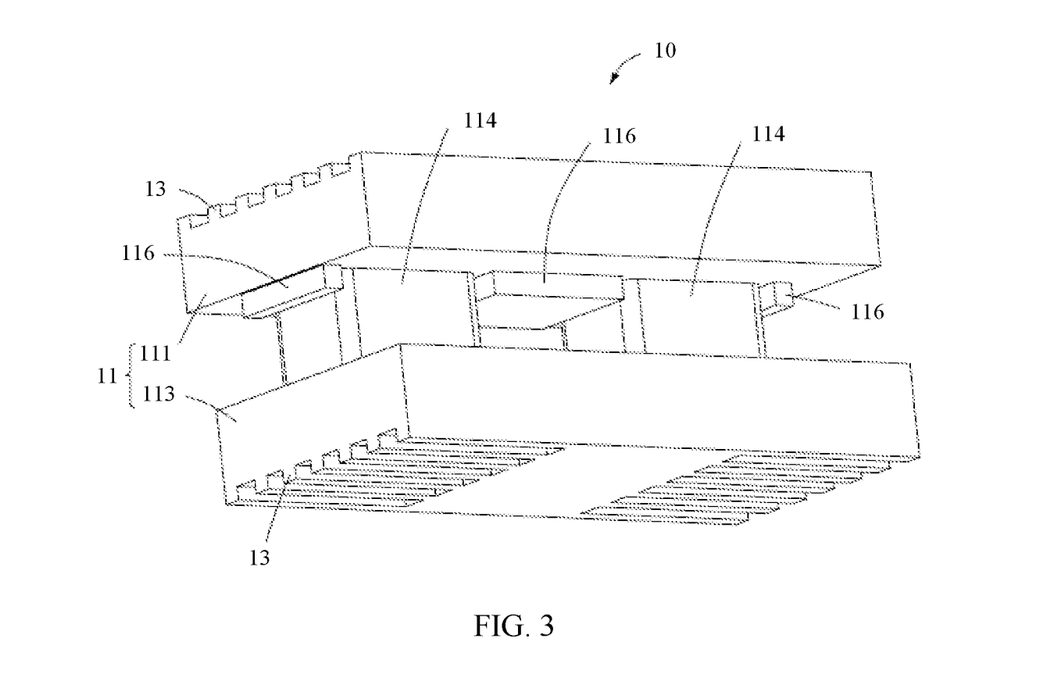
FIG. 3 is a schematic three-dimensional view of a magnetic core of the magnetic power component in FIG. 1.

As shown in FIG. 2 and FIG. 3, the magnetic core body 11 includes a first magnetic core part 111 and a second magnetic core part 113 that are connected to each other, and the printed circuit board 30 is approximately located between the first magnetic core part 111 and the second magnetic core part 113. Usually, the first magnetic core part 111 and the second magnetic core part 113 are separately formed. The first magnetic core part 111 includes a main body part 112 and at least one support part 114 protruded from a surface of the main body part 112, and the main body part 112 and the support part 114 are integrally formed. In some embodiments, the main body part 112 is plate-shaped, and the support part 114 is substantially columnar. At least one through hole 31 penetrating through the printed circuit board 30 is disposed in the printed circuit board 30, and each through hole 31 corresponds to one support part 114. Each support part 114 penetrates through one corresponding through hole 31 to be bonded to the second magnetic core part 113. In this disclosure, a structure of the first magnetic core part 111 is described above, and there is no special requirement for a structure of the second magnetic core part 113 (for example, the second magnetic core part 113 may be any plate-shaped mirror structure symmetrical to the first magnetic core part 111, and is not limited thereto), provided that the second magnetic core part 113 can be connected to the first magnetic core part 111 to sandwich the printed circuit board 30 between the first magnetic core part 111 and the second magnetic core part 113. An adhesive (not shown in the figure) may be disposed on a bonding interface between the support part 114 and the second magnetic core part 113, to firmly bond the first magnetic core part 111 and the second magnetic core part 113. The printed circuit board 30 is located between the main body part 112 and the second magnetic core part 113. An opening size of the through hole 31 is greater than a cross-section size of the support part 114, to ensure that the support part 114 can easily penetrate through the through hole 31 in an assembly process.

As shown in FIG. 2, the plurality of heat dissipation teeth 13 are protruded from an outer surface that is of the first magnetic core part 111 and that faces away from the printed circuit board 30 and an outer surface that is of the second magnetic core part 113 and that faces away from the printed circuit board 30. The first magnetic core part 111 and heat dissipation teeth 13 protruded therefrom are integrally formed. The second magnetic core part 113 and heat dissipation teeth 13 protruded therefrom are integrally formed. At least one of the first magnetic core part 111 and the second magnetic core part 113 is bonded to the printed circuit board 30.

As shown in FIG. 2 and FIG. 3, in this embodiment, the magnetic core 10 may be a UI-type magnetic core, the first magnetic core part 111 is substantially U-shaped, and the second magnetic core part 113 is a plate-shaped I-shaped. The first magnetic core part 111 includes a plate-shaped main body part 112 and two spaced-apart support parts 114 located on a same surface of the main body part 112. Each support part 114 is columnar. Two through holes 31 penetrating through the printed circuit board 30 are disposed in the printed circuit board 30, and each through hole 31 corresponds to one support part 114. Each support part 114 penetrates through one corresponding through hole 31 to be bonded to the second magnetic core part 113 through contact. In this embodiment, the second magnetic core part 113 is spaced apart from the printed circuit board 30. Heat dissipation teeth 13 are protruded from the outer surface that is of the first magnetic core part 111 and that faces away from the printed circuit board 30, and heat dissipation teeth 13 are also protruded from the outer surface that is of the second magnetic core part 113 and that faces away from the printed circuit board 30, so that a plurality of heat dissipation teeth 13 are respectively disposed on two opposite surfaces of the magnetic core body 11. Because the two outer surfaces are surfaces that are of the magnetic core body 11 and that are in large-area contact with outside air, the two outer surfaces are selected as surfaces on which the heat dissipation teeth 13 are located. The reason why no heat dissipation tooth 13 is disposed on a surface that is of the second magnetic core part 113 and that is close to the printed circuit board 30 is as follows: Although the second magnetic core part 113 is spaced apart from the printed circuit board 30, a gap between the second magnetic core part 113 and the printed circuit board 30 is relatively small, a formed air duct is limited, and a heat dissipation effect is not very good. In addition, in this disclosure, a part of the first magnetic core part 111 is bonded to the printed circuit board 30, the first magnetic core part 111 further includes at least one bump 116 integrally formed with the main body part 112, and the bump 116 is directly bonded to the printed circuit board 30. In this embodiment, there are three bumps 116. There is a plurality of bumps 116, to ensure a bonding contact area between the first magnetic core part 111 and the printed circuit board 30. The bump 116 and the two support parts 114 are located on the same surface of the main body part 112, and the bump 116 is spaced apart from the two support parts 114. A thickness of each bump 116 is less than a thickness of the support part 114, so that the bump 116 can be bonded to the printed circuit board 30. In this way, heat generated by the printed circuit board 30, especially, heat generated by the winding, can be conducted to the first magnetic core part 111 by using the bump 116, and the heat is dissipated by using the magnetic core 10.

It may be understood that, in another embodiment, although not shown in the figure, alternatively, the second magnetic core part 113 may include a bump 116 to implement bonding to the printed circuit board 30.

Figure 5A:
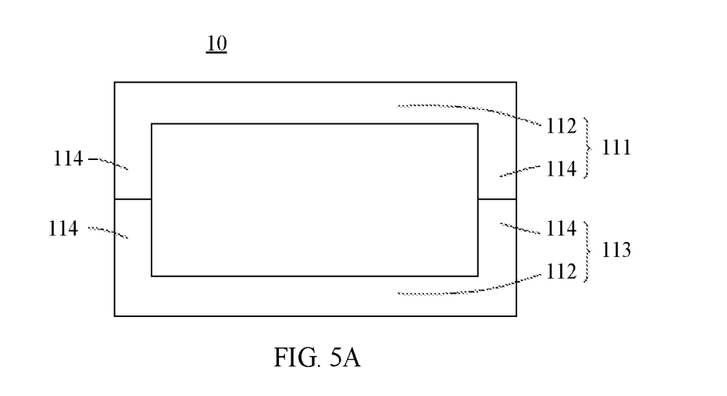
FIG. 5A to FIG. 5C are schematic planar views of magnetic cores in three modified embodiments.

It may be understood that the magnetic core 10 of the magnetic power component 100 is not limited to the UI-type magnetic core, and may be alternatively another magnetic core. As shown in FIG. 5A, the magnetic core 10 is a UU-type magnetic core or the like. That is, both the first magnetic core part 111 and the second magnetic core part 113 are U-shaped. The first magnetic core part 111 and the second magnetic core part 113 each include a plate-shaped main body part 112 and two spaced-apart support parts 114 located on a same surface of the main body part 112. Correspondingly, although not shown in the figure, two through holes are disposed in the printed circuit board for two support parts 114 of the first magnetic core part 111 to respectively penetrate through to be bonded to two support parts 114 of the second magnetic core part 113. Likewise, although not shown in the figure, the first magnetic core part 111 or the second magnetic core part 113 further includes a bump integrally formed with the main body part 112, to implement bonding to the printed circuit board 30 by using the bump.

Figure 5B:
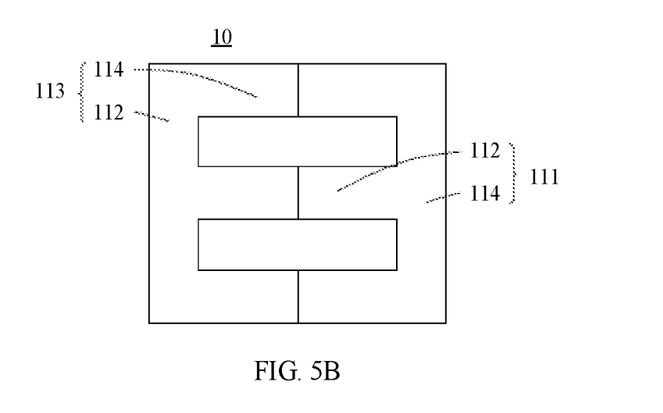

As shown in FIG. 5B, the magnetic core 10 is an EE-type magnetic core, and both the first magnetic core part 111 and the second magnetic core part 113 are E-shaped. The first magnetic core part 111 and the second magnetic core part 113 each include a plate-shaped main body part 112 and three spaced-apart support parts 114 located on a same surface of the main body part 112. Three support parts 114 of the first magnetic core part 111 are bonded to three support parts 114 of the second magnetic core part 113 in a one-to-one correspondence manner. Correspondingly, although not shown in the figure, three through holes are disposed in the printed circuit board for the three support parts 114 of the first magnetic core part 111 to respectively penetrate through to be respectively bonded to the three support parts 114 of the second magnetic core part 113. Likewise, although not shown in the figure, the first magnetic core part 111 or the second magnetic core part 113 further includes a bump integrally formed with the main body part 112, to implement bonding to the printed circuit board 30 by using the bump.

Figure 5C:
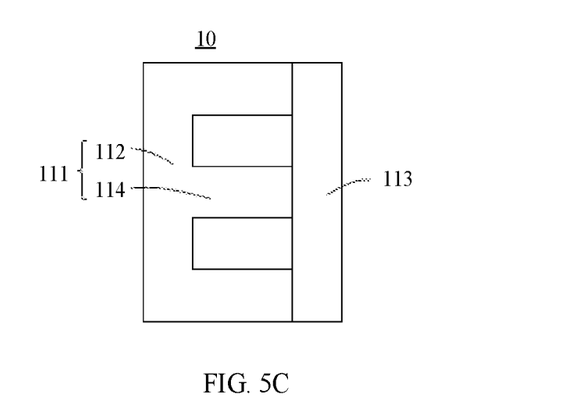

As shown in FIG. 5C, the magnetic core 10 is an EI-type magnetic core. That is, the first magnetic core part 111 is E-shaped, and the second magnetic core part 113 is plate-shaped I-shaped. The first magnetic core part 111 includes a plate-shaped main body part 112 and three spaced-apart support parts 114 located on a same surface of the main body part 112. Correspondingly, although not shown in the figure, three through holes are disposed in the printed circuit board for the three support parts 114 of the first magnetic core part 111 to respectively penetrate through to be bonded to the second magnetic core part 113. Likewise, although not shown in the figure, the first magnetic core part 111 or the second magnetic core part 113 further includes a bump integrally formed with the main body part 112, to implement bonding to the printed circuit board 30 by using the bump.

It may be understood that the magnetic core 10 is not limited to the structures shown in FIG. 3 and FIG. 5A to FIG. 5C, and may be alternatively a magnetic core of another shape.

It may be understood that, the magnetic core 10 may be bonded to the printed circuit board 30 through direct contact, or a thermal conductive interface material may be disposed on a connection interface between the magnetic core 10 and the printed circuit board 30.

It may be understood that, although not shown in the figure, other electronic elements such as a resistor and a capacitor may be further disposed on the printed circuit board 30.

Figure 4:
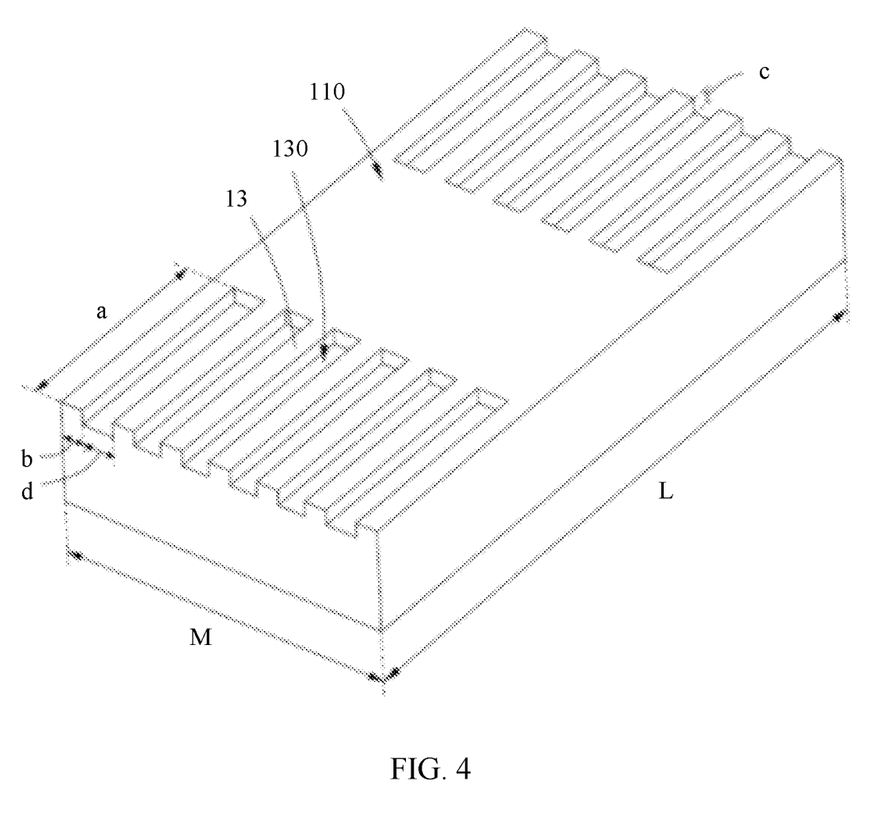
FIG. 4 is a schematic partial view of a magnetic core.

As shown in FIG. 4, each heat dissipation tooth 13 extends to be strip-shaped. In this embodiment, a plurality of heat dissipation teeth 13 located on a same outer surface of the magnetic core body 11 are parallel to each other and spaced apart. There is a strip-shaped groove 130 between two adjacent heat dissipation teeth 13. A size of the heat dissipation tooth 13 may be adjusted and designed based on a requirement. Each heat dissipation tooth 13 has a length a in an extension direction, a width b perpendicular to the extension direction, a height c perpendicular to the outer surface of the magnetic core body, and a distance d between adjacent heat dissipation teeth 13.

An air-cooled heat dissipation apparatus, for example, a heat dissipation fan, is usually further disposed near the magnetic power component 100, to quickly take away, by using flowing air, heat generated by the magnetic core 10 and the printed circuit board 30, to implement a good heat dissipation effect, and prevent a device from being damaged due to a high temperature. A direction of the length a of the heat dissipation tooth 13 is usually an air duct direction. Therefore, the extension direction of the heat dissipation tooth 13 on the surface of the magnetic core 10 and an air flow direction are designed to keep the two directions consistent. If the two directions are inconsistent, an air flow rate is reduced, and a heat dissipation effect is greatly reduced.

The length a of the heat dissipation tooth 13 is usually equal to an overall length L of the magnetic core. However, in this embodiment, as shown in FIG. 4, heat dissipation teeth 13 are disposed on only two side parts of the outer surface that is of the magnetic core body 11 and on which the heat dissipation teeth 13 are disposed, and the middle of the two side parts is a smooth region 110 with a smooth surface. The smooth region 110 is disposed, so that when the magnetic power component 100 is automatically processed and assembled, a suction nozzle can be sucked onto the smooth region to implement automatic grasping of the magnetic core. In this embodiment, a surface that is of the heat dissipation tooth 13 and that faces away from the magnetic core body 11 is flush with the smooth region, so that molding difficulty of the magnetic core 10 can be reduced. It may be understood that, in actual application, it may be determined, based on a requirement, whether the heat dissipation teeth 13 are disposed on the entire outer surface or a part of the outer surface.

If both the length L and a width M of the magnetic core are determined, the width b of the heat dissipation tooth 13 and the distance d between the heat dissipation teeth 13 jointly determine a quantity n of heat dissipation teeth 13 on one outer surface of the magnetic core, where $n=M/(b+d)$. A smaller sum of the width b of the heat dissipation tooth 13 and the distance d between the heat dissipation teeth 13 indicates a larger quantity n of heat dissipation teeth 13. In addition, the quantity n of heat dissipation teeth 13 and the height c and the length a of the heat dissipation tooth 13 further jointly determine an added heat dissipation area of the magnetic core: $S=c \times a \times 2n$. Based on a consideration of increasing a heat dissipation area, theoretically, it is better if the length a and the height c are larger, and it is better if the width b and the distance d are smaller. However, due to a formation process capability of a mold, to ensure large-scale production, the width b that is of each heat dissipation tooth 13 and that is perpendicular to the extension direction is greater than or equal to 2 mm. A distance between two adjacent heat dissipation teeth 13 located on a same outer surface is greater than or equal to 1 mm. A height that is of each heat dissipation tooth 13 and that is perpendicular to an outer surface on which the heat dissipation tooth 13 is located is less than or equal to 2 mm.

Figure 6:
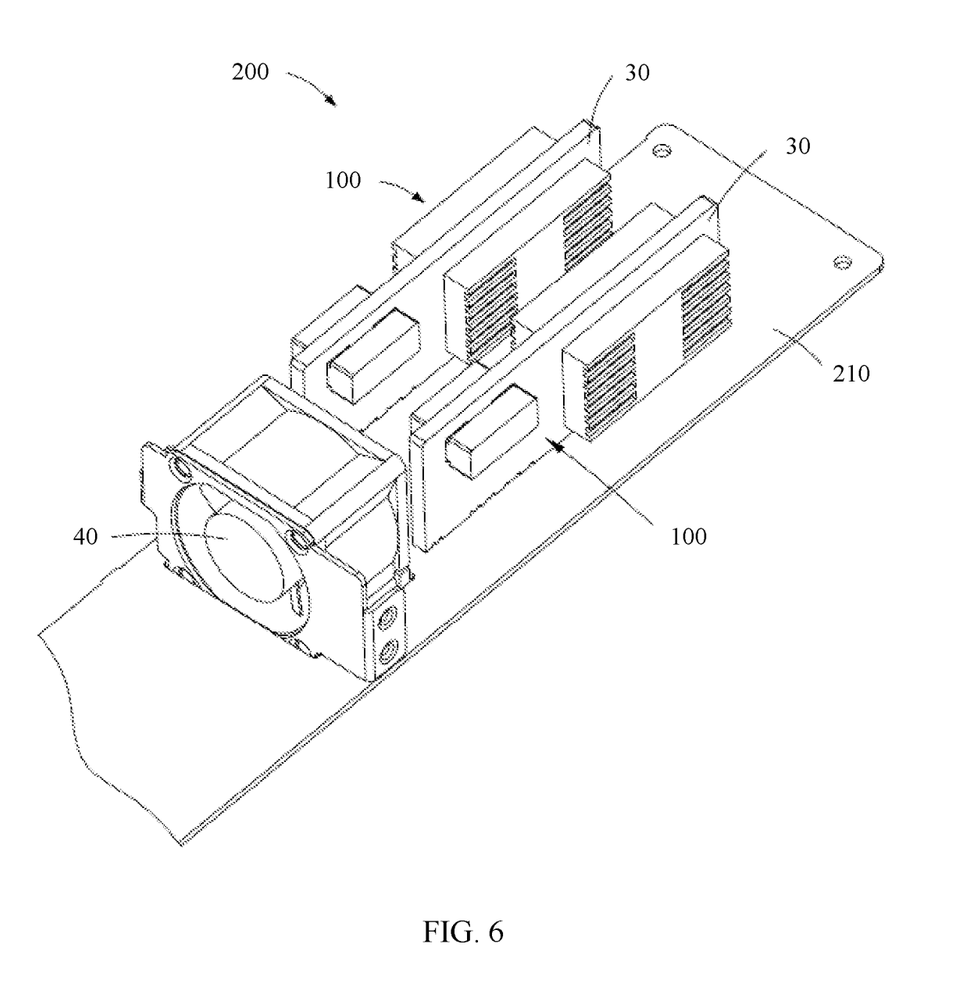
FIG. 6 is a schematic three-dimensional view of a power module.

As shown in FIG. 6, this disclosure further provides a power module 200, including a substrate 210 and a magnetic power component 100 disposed on the substrate 210. The power module 200 may be a transformer, an inductor, or the like, but is not limited thereto. The magnetic power component 100 is perpendicularly plugged into the substrate 210 by using a printed circuit board 30. The substrate 210 is also a printed circuit board. In this embodiment of this disclosure, two spaced-apart magnetic power components 100 are disposed on the substrate 210. In this embodiment, printed circuit boards 30 of the two magnetic power components 100 are disposed in an opposite and parallel manner. A heat dissipation fan 40 is further disposed on the substrate 210, and the heat dissipation fan 40 is located at a same end of the two magnetic power components 100. Air blown from the heat dissipation fan 40 is blown to the two magnetic power components 100, and an air duct direction is consistent with an extension direction of a heat dissipation tooth 13 of the magnetic power component 100. Heat generated on a surface of a magnetic core 10 is quickly taken away by using flowing air blown from the heat dissipation fan 40, to implement a good heat dissipation effect, and prevent a device from being damaged due to a high temperature. As shown in FIG. 2, a plurality of bulges 101 are formed on an end face of the printed circuit board 30 of the magnetic power component 100, and plug-connection holes (not shown in the figure) are correspondingly disposed on the substrate 210, so that the printed circuit board 30 can be plug-connected to the plug-connection holes of the substrate 210 by using the bulges 101, to implement fastened connection between the printed circuit board 30 and the substrate 210, and the printed circuit board 30 is electrically connected to the substrate 210.

Simulation Data Verification of a Heat Dissipation Effect:

Two magnetic cores of a same size are selected and applied to two transformers of a same size and specification. The two magnetic cores are the same in length, width, and thickness. A difference is that heat dissipation teeth are disposed on one magnetic core, and no heat dissipation tooth is disposed on the other magnetic core as a comparison instance. Based on thermal simulation data, compared with the comparison instance, a temperature of a printed circuit board winding of a planar transformer including the magnetic core on which the heat dissipation teeth are disposed decreases by 4.4 degrees Celsius (° C.), and a temperature of a magnetic core body decreases by 11° C.

This disclosure differs from the other technology in the following improvements:

(1) Material costs: No additional material such as a heat sink, an adhesive, or a thermal pad is required, thereby reducing material costs.

(2) Applicable scenario: The heat dissipation teeth of the magnetic core can match the magnetic core body and an environment in which the magnetic core body is located, for free size design. The heat dissipation teeth are integrally formed with the magnetic core, so that there is no risk that a heat dissipation part falls off or heat dissipation performance decreases after long-term operating.

(3) Process difficulty: The heat dissipation teeth of the magnetic core can be manufactured at one time through moldmaking, and is suitable for large-scale production. There is no need to re-design other materials for a size of the magnetic core. Considering an assembly scheme, process costs are reduced.

(4) Volume advantage: Because no material such as a heat sink, an adhesive, or a thermal pad needs to be additionally disposed, overall occupied space of the magnetic power component in this disclosure is relatively small, thereby facilitating miniaturization of the power module.

It should be noted that, the foregoing descriptions are merely specific implementations of this disclosure, but the protection scope of this disclosure is not limited thereto. Any variation or replacement readily figured out by a person skilled in the art within the technical scope disclosed in this disclosure shall fall within the protection scope of this disclosure. The implementations of this disclosure and the features in the implementations can be mutually combined if they do not conflict with each other. Therefore, the protection scope of this disclosure shall be subject to the protection scope of the claims.

What is claimed is:

1. A magnetic power component, comprising:
a printed circuit board; and
a magnetic core assembled to the printed circuit board and comprising:
a magnetic core body bonded to the printed circuit board and comprising an outer surface facing away from the printed circuit board; and
a plurality of heat dissipation teeth bonded to the magnetic core body through direct contact and protruding from the outer surface, wherein the magnetic core body further comprises:
a first magnetic core part comprising:
a main body part comprising:
a first surface facing away from the printed circuit board and comprising a first portion of the plurality of heat dissipation teeth; and
a second surface facing the printed circuit board; and
a support part connected to the second surface and penetrating through the printed circuit board; and
a second magnetic core part comprising:
a third surface facing away from the printed circuit board and comprising a second portion of the plurality of heat dissipation teeth; and
a fourth surface facing the printed circuit board and connected to the support part,
wherein the printed circuit board is located between the main body part and the second magnetic core part, and
wherein the first magnetic core part further comprises a first bump integrally formed with the main body part and located on the second surface, or wherein the second magnetic core part further comprises a second bump located on the fourth surface and bonded to the printed circuit board.

2. The magnetic power component of claim 1, wherein at least one of the first magnetic core part or the second magnetic core part is bonded to the printed circuit board.

3. The magnetic power component of claim 1, wherein the first magnetic core part and the first portion are integrally formed by using a magnetic material, and wherein the second magnetic core part and the second portion are integrally formed by using the magnetic material.

4. The magnetic power component of claim 1, wherein the magnetic core is a UI-type magnetic core, an EE-type magnetic core, an EI-type magnetic core, or a UU-type magnetic core.

5. The magnetic power component of claim 1, wherein each heat dissipation tooth extends to be strip-shaped, wherein first teeth within the first portion are parallel to each other and spaced apart, and wherein second teeth within the second portion are parallel to each other and spaced apart.

6. The magnetic power component of claim 1, further comprising a thermal conductive interface material disposed on a connection interface between the magnetic core body and the printed circuit board.

7. The magnetic power component of claim 1, wherein each heat dissipation tooth has a width that is perpendicular to an extension direction and is greater than or equal to 2 millimeters (mm).

8. The magnetic power component of claim 1, wherein a distance between two adjacent heat dissipation teeth is greater than or equal to 1 millimeter (mm).

9. The magnetic power component of claim 1, wherein each heat dissipation tooth has a height that is perpendicular to the outer surface and is less than or equal to 2 millimeters (mm).

10. The magnetic power component of claim 1, further comprising a winding integrated into the printed circuit board.

11. A power module, comprising:
a substrate; and
a magnetic power component disposed on the substrate and comprising:
a printed circuit board; and
a magnetic core assembled to the printed circuit board and comprising:
a magnetic core body bonded to the printed circuit board and comprising an outer surface facing away from the printed circuit board; and
a plurality of heat dissipation teeth bonded to the magnetic core body through direct contact and protruding from the outer surface, wherein the magnetic core body further comprises:
a first magnetic core part comprising:
a main body part comprising:
a first surface facing away from the printed circuit board and comprising a first portion of the plurality of heat dissipation teeth; and
a second surface facing the printed circuit board; and
a support part connected to the second surface and penetrating through the printed circuit board; and
a second magnetic core part comprising:
a third surface facing away from the printed circuit board and comprising a second portion of the plurality of heat dissipation teeth; and
a fourth surface facing the printed circuit board and connected to the support part, wherein the printed circuit board is located between the main body part and the second magnetic core part, and
wherein the first magnetic core part further comprises a first bump integrally formed with the main body part and located on the second surface, or wherein the second magnetic core part further comprises a second bump located on the fourth surface and bonded to the printed circuit board.

12. The power module of claim 11, wherein the substrate is a circuit board, and wherein the printed circuit board is perpendicularly plugged into the substrate.

13. The power module of claim 11, wherein the power module further comprises a heat dissipation fan disposed on the substrate and located at an end of the magnetic power component.

14. The power module of claim 13, wherein the plurality of heat dissipation teeth extends to be strip-shaped, and wherein an extension direction of the plurality of heat dissipation teeth is consistent with an air duct direction of the heat dissipation fan.

15. The magnetic power component of claim 1, wherein the first magnetic core part is bonded to the printed circuit board.

16. The magnetic power component of claim 1, wherein the second magnetic core part is bonded to the printed circuit board.

17. The magnetic power component of claim 1, wherein the first magnetic core part further comprises a bump integrally formed with the main body part and located on the second surface.

18. A magnetic power component, comprising:
a printed circuit board; and
a magnetic core assembled to the printed circuit board and comprising:
a magnetic core body bonded to the printed circuit board and comprising an outer surface facing away from the printed circuit board; and
a plurality of heat dissipation teeth bonded to the magnetic core body through direct contact and protruding from the outer surface, wherein the magnetic core body further comprises:
a first magnetic core part comprising:
a main body part comprising:
a first surface facing away from the printed circuit board and comprising a first portion of the plurality of heat dissipation teeth; and
a second surface facing the printed circuit board; and
a support part connected to the second surface and penetrating through the printed circuit board; and
a second magnetic core part comprising:
a third surface facing away from the printed circuit board and comprising a second portion of the plurality of heat dissipation teeth;
a fourth surface facing the printed circuit board and connected to the support part; and
a bump located on the fourth surface and bonded to the printed circuit board, wherein the printed circuit board is located between the main body part and the second magnetic core part.

19. The magnetic power component of claim 18, wherein at least one of the first magnetic core part or the second magnetic core part is bonded to the printed circuit board.

20. The magnetic power component of claim 19, wherein the first magnetic core part and the first portion are integrally formed by using a magnetic material, and wherein the second magnetic core part and the second portion are integrally formed by using the magnetic material.

\* \* \* \* \*